United States Patent [19]

Dyer

[11] 4,210,937
[45] Jul. 1, 1980

[54] SOLID STATE POWER OUTAGE RECORDING CIRCUIT

[75] Inventor: Robert E. Dyer, Springfield, Ill.

[73] Assignee: Sangamo Weston, Inc., Atlanta, Ga.

[21] Appl. No.: 903,761

[22] Filed: May 8, 1978

[51] Int. Cl.² ............................................... G11B 5/00
[52] U.S. Cl. ............................................ 360/6; 360/5
[58] Field of Search .................. 360/5, 6, 61; 324/113

[56] References Cited

U.S. PATENT DOCUMENTS

| | | | |
|---|---|---|---|
| 3,829,772 | 8/1974 | Marsh et al. | 360/6 |
| 3,889,289 | 6/1975 | Kubach | 360/6 |
| 3,913,129 | 10/1975 | Synder et al. | 360/6 |
| 3,913,130 | 10/1975 | Doby | 360/6 |
| 3,921,207 | 11/1975 | Doby et al. | 360/6 |
| 4,065,793 | 12/1977 | Maxwell, Jr. | 360/6 |
| 4,122,498 | 10/1978 | Dyer | 360/6 |

Primary Examiner—Vincent P. Canney

Attorney, Agent, or Firm—Emrich, Root, O'Keeffe & Lee

[57] ABSTRACT

A power outage indicating circuit for recording apparatus of the type which records data pulses along with a time reference on magnetic tape includes a silicon controlled rectifier which is normally maintained conducting to maintain a timing capacitor charged as long as power is supplied to the power outage circuit. Upon loss of power, the SCR device is rendered nonconducting permitting the timing capacitor to discharge. After power has been restored, the SCR device is triggered into conduction in response to the closing of a cam operated outage switch and supplies charging current to the timing capacitor. While the capacitor is charging, the charging current enables a time track head driver circuit to effect reversal of the direction of current flow through the winding of a time track recording head, causing an outage pulse to be recorded on the magnetic tape. A delay circuit prevents the power outage circuit from responding to line transients.

10 Claims, 3 Drawing Figures

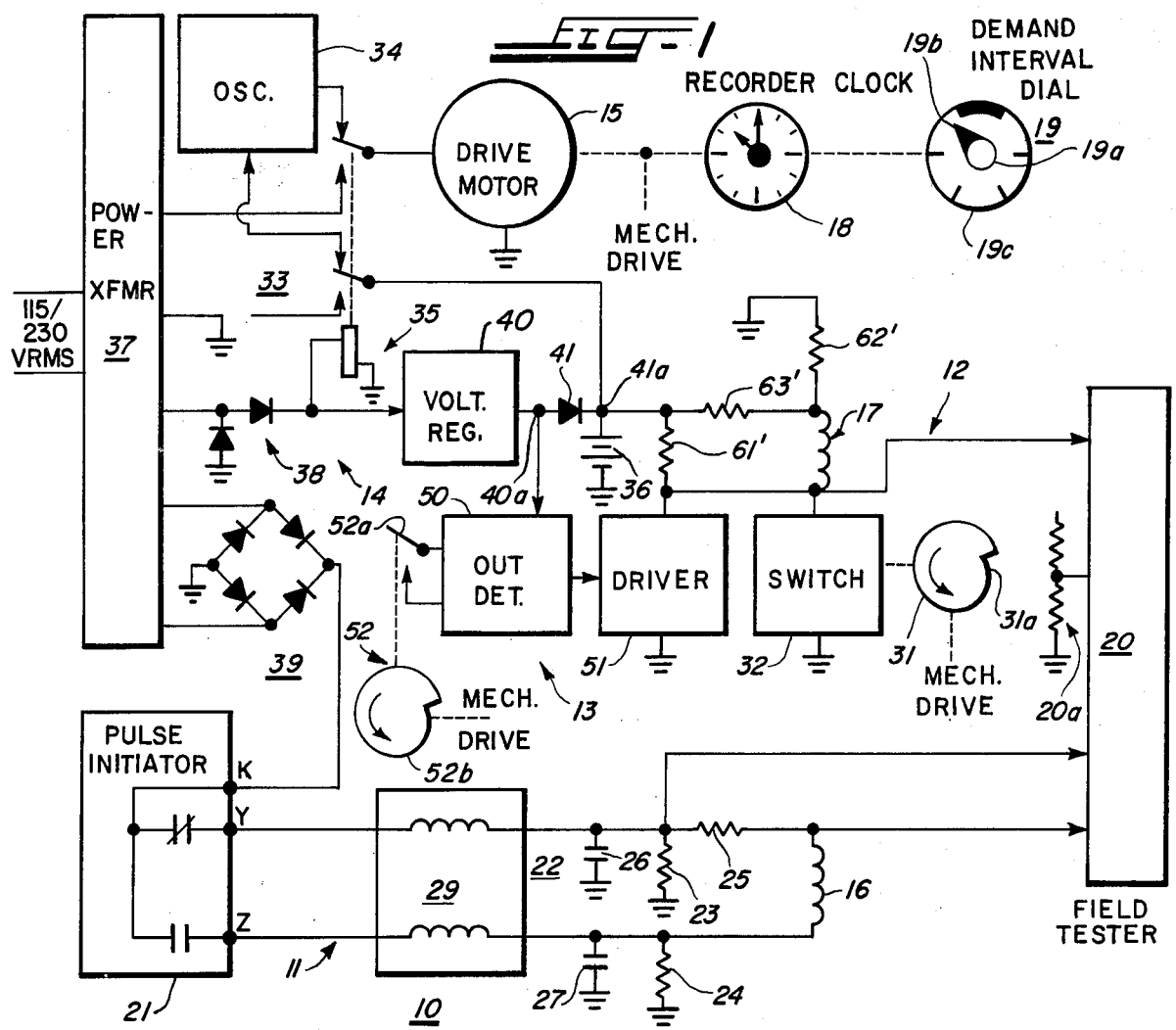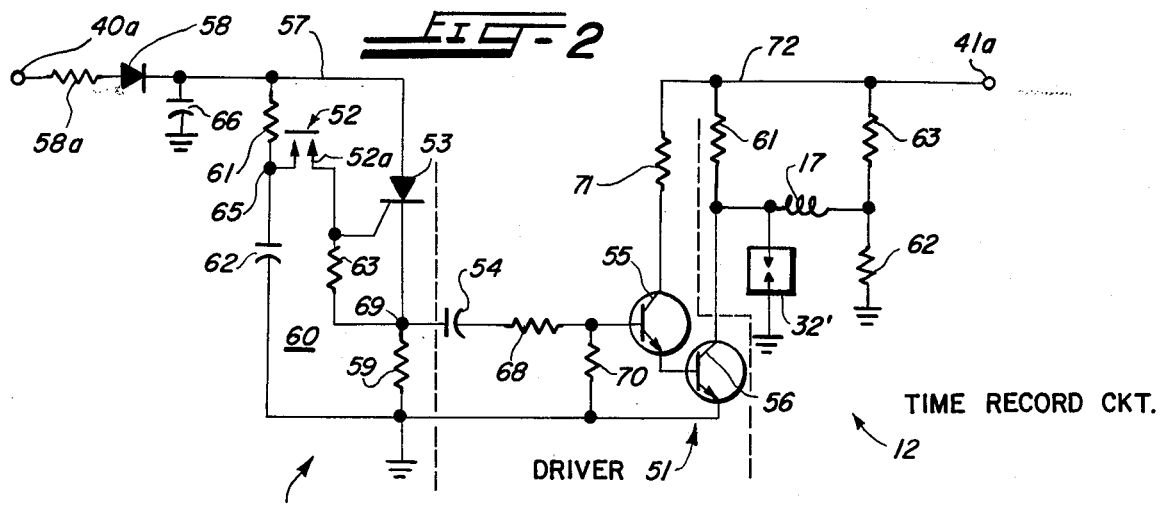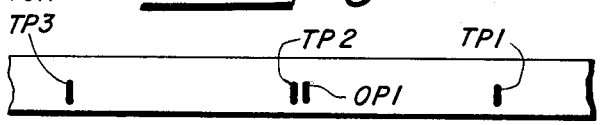

SOLID STATE POWER OUTAGE RECORDING CIRCUIT

BACKGROUND OF THE INVENTION

1. Field of the Invention

This invention relates to recording apparatus, such as billing or load survey recorders which are used in the electrical utility field, for recording information relating to power usage on a recording medium, and more particularly, to a power outage indicating circuit for use in such recording apparatus for detecting a power outage condition and recording a power outage indication on the recording medium.

2. Description of the Prior Art

Recording apparatus, such as billing or load survey recorders, are employed by electrical utility companies for measuring electrical parameters and recording data for use in calculating quantities such as power consumption, maximum demand billing, peak load information, and the like over extended periods, typically in the order of a month. One such recording apparatus is disclosed in the U.S. Pat. No. 3,892,772 issued to Norman F. Marsh et al on Aug. 13, 1974. The recording apparatus includes a cassette tape recorder unit having a tape drive which is driven by a synchronous motor energized by power from the AC source being measured to advance a magnetic tape past recording heads, allowing recording of power usage data on tape. The synchronous motor also drives a timing device, embodied as a cam operated time interval switch, to effect the generation of a timing pulse for every fifteen minutes of operation of the motor. The timing pulses control a time record circuit which controls current flow through a time track recording head to record a discrete timing signal on the tape to indicate times of occurrence of the fifteen minute intervals. An NRZ recording format is used for recording time information on the tape. A power outage circuit provides a recorded indication of power interruptions which are in excess of a predetermined duration. The power outage circuit includes a latch circuit which inhibits the time record circuit for a time following restoration of power to prevent current flow through the time track head until the next time the time interval switch operates. This causes two half-amplitude pulses to recorded, with their location and polarity being distinguishable from timing pulses, providing an indication of the power outage.

Other examples of data recorders including power outage circuits are disclosed in the U.S. Pat. No. 3,921,207 which was issued to William P. Doby on Nov. 18, 1975, and in the U.S. Pat. No. 3,913,129 which was issued to Carl J. Snyder on Oct. 14, 1975. In both of these circuits an outage indication is recorded by charging a capacitor following a power outage and the discharging the capacitor over the time record head winding. In normal operation the charging path for the capacitor is interrupted as the result of operation of a relay which is maintained energized as long as power is supplied to the circuit. Upon loss of power, the relay is deenergized and the capacitor is permitted to charge when power is restored. In the circuit shown by Doby, the capacitor charges as soon as power is provided, and in the circuit shown by Snyder, the capacitor charges in response to the operation of an SCR. After restoration of power, the operation of an outage switch allows the capacitor to discharge over the time record head effecting recording of an outage pulse on the tape. The relay is also operated to prevent the capacitor from recharging. The SCR used in the circuit shown in the Snyder patent, isolates the timing capacitor from the power source. The SCR, which is energized by an AC signal, is normally non-conducting and is triggered with restoration of power, and the operation of the outage switch.

SUMMARY OF THE INVENTION

The present invention provides a power outage indicating circuit for use in recording apparatus of the type which records data pulses along with a time reference on magnetic tape. The power outage circuit detects a power outage condition and effects the recording of a power outage indication on the recording medium. The power outage circuit includes a silicon controlled rectifier which is normally maintained conducting to maintain a timing capacitor charged as long as power is supplied to the power outage circuit. Upon loss of power, the SCR device is rendered nonconducting permitting the timing capacitor to discharge. After power has been restored, the SCR device is triggered into conduction in response to the closing of a cam operated outage switch and supplies charging current to the timing capacitor. While the capacitor is charging, the charging current enables a time track head driver circuit to effect reversal of the direction of current flow through the winding of a time track recording head, causing an outage pulse to be recorded on the magnetic tape. When the timing capacitor is charged, the flow of charging current ceases and the head driver circuit is disabled. The SCR device remains conducting maintaining the timing capacitor charged to prevent recording of further output pulses until a subsequent power outage occurs.

The outage switch is mechanically linked to a demand interval timing cam which generates timing pulses to define demand intervals. The outage switch is operated at a predetermined time before the start of a demand interval so that the outage indication is recorded just before the next demand interval pulse.

The trigger network for the SCR device includes a further capacitor which charges following restoration of power, and if the outage switch is open, and is discharged into the gate of the SCR device the next time the outage switch closes. This triggers the device into conduction to enable the timing capacitor to charge and effect recording of the outage pulse.

A delay feature is incorporated into the power outage circuit to prevent it from activating due to line transients of up to four to eight seconds. The SCR device is maintained conducting by discharge current of a capacitor having a discharge time in the order of four to eight seconds following loss of power.

The power outage circuit provided by the present invention, employs only one cam operated switch, and the circuit obviates the need for a mechanical relay or the like for controlling the charging and discharging of the timing capacitor.

DISCRIPTION OF THE DRAWINGS

FIG. 1 is a block diagram of a demand recorder employing the power outage indicating circuit provided by the present invention;

FIG. 2 is a schematic circuit diagram of the power outage indicating circuit and a time track record circuit of the demand recorder; and FIG. 3 is a simplified representation of the recording medium showing the relationship between timing, data and power outage pulses recorded on the medium.

DISCRIPTION OF THE PREFERRED EMBODIMENT

Referring to the drawings, the power outage indicating circuit is described with reference to an application in a demand recorder 10 shown in block diagram form in FIG. 1. The demand recorder provides a record on magnetic tape from which energy use in kilowatt hours can be determined. The recorder employs a magnetic tape cartridge of the type known in the art which is driven by a hysteresis synchronous motor 15 which has a self-contained gear train. Record durations of 36, 72 or 108 hours may be provided as a function of the gear reduction ratio in the tape drive system.

The recorder includes a data track recording circuit 11, a time track recording circuit 12, the power outage indicating circuit 13 and DC power supply circuits 14. The data record circuit 11 includes a three wire pulse initiating circuit 21 which is mounted on a watt hour meter (not shown). The pulse initiating circuit provides pulses representing kilowatt hours, or any other parameter, to the winding 16 of the data track recording head over a data record network 22 for recording on a data track of the tape.

The time track record circuit 12 includes an interval cam 31 which is mechanically linked to the tape drive motor 15 as represented by the dashed lines in FIG. 1. The cam 31 is driven by the tape drive motor and gear train to make one revolution each demand interval, which is assumed to be every 15 minutes. Once each demand interval, the timing cam 31 operates a solid state switch 32 to effect reversal of current flow through the winding 17 of the time track record head to record a demand interval time reference pulse on the time track of the magnetic tape.

The power outage circuit 13 detects a power outage condition and records a pulse on the time track just prior to a timing pulse to indicate that a power outage has occurred. The power outage indicating circuit 13 includes a power outage detector circuit 50, a time head driver circuit 51 and a cam operated outage switch 52. Briefly, the power outage detector circuit 50, shown in schematic circuit diagram form in FIG. 2, includes a normally conducting silicon controlled rectifier 53 which maintains a timing capacitor 54 charged. Upon occurrence of a power outage of a duration of four to eight seconds, the SCR device 53 is rendered non-conducting permitting the capacitor 54 to discharge. When power is restored and the outage switch 52 closes, the SCR device 53 is triggered into conduction in a manner to be described, allowing the capacitor 54 to charge. The capacitor charging circuit enables transistors 55 and 56 of the head driver circuit 51 to reverse the direction of current flow through the time track head winding 17 to record an outage pulse on the tape.

When translated, the recorded information accurately denotes the consumer's demand characteristics as well as the time at which peak consumption occurred. The recorded information, which includes data pulses along with a time reference, and power outage indications, permits analysis not only of customer load and demand, but also provides continuity of service data.

The recorder circuits operate from a line voltage of 115/230 VRMS. The DC power supply circuits 14 respond to the AC input to provide suitable DC voltages for the data and time record circuits and the power outage circuit. A battery carryover circuit 33 enables the recorder to continue full operation during a power outage condition. During this time, the synchronous tape drive motor is powered from the output of a crystal control oscillator and amplifier circuit 34. A change over relay 35 extends power from a battery 36 to the oscillator and amplifier circuit. During a power outage, the time track recording circuit 12 is energized by power from the battery. This enables continuous recording of timing pulses since battery carryover maintains tape motion permitting time marks to be recorded.

A time clock 18 driven from the output shaft of the drive motor 15 provides a standard twelve hour display with hands for hours and minutes.

An interval dial 19 is provided to indicate permissible cartridge exchange periods. The interval dial consists of a knob 19a with a pointer 19b and a concentric circle 19c having index marks of uniform time division and a blackened area to indicate the portion of the interval during which the time interval cam 31 operates solid state switch 32. The tape cartridge may be changed only when the pointer 19b is outside of the blackened area. The time interval cam 31, which is attached to the shaft mounting the pointer 19b, may be rotated by use of the knob 19a. The clock display is also advanced with rotation of the interval knob.

A field tester 20, includes a plurality of light emitting diodes (not shown) which indicate alternating head current for the data and time track recording heads. Two voltage comparator circuits and two light emitting diodes are provided for the data track. The voltage comparators are connected on either side of the head current limiting resistor 25 and the voltages at these points are compared with a reference voltage established by resistance voltage divider 20a. When either of thse voltages compares with the reference voltage, the comparator output energizes its associated light emitting diode. In the time track, a further comparator circuit compares the DC voltage at one side of the head winding 17 with the reference voltage and energizes a first light emitting diode when the DC voltage is at ground potential and energizes a second light emitting diode when such voltage is between ground and the DC supply level of +14.1 VDC. Should the head winding open, the voltage would rise to 14.1 VDC causing a further light emitting diode to be energized.

A clock type register (not shown) driven by a stepper motor 29, connected in the data head record network 22 registers the total number event or data pulses recorded during a given recording interval.

Power Supply Circuits

Considering the recorder circuits in more detail, either 115 or 230 VRMS line voltage is applied to the recording circuits over a power transformer 37. A DC voltage at a level of approximately +24 VDC is provided over bridge network 38 and is applied to a voltage regulator circuit 40 which provides a regulated output of +14.8 VDC to the power outage detecting circuit 50 and over diode 41, which drops the voltage to +14.1 VDC at point 41A, to the time record circuit 12. The 24 VDC output of the power transformer also energizes relay 35 to disable the battery carryover circuit 33 whenever primary power is available. The data record circuits 11, including the pulse initiator 21 are energized by a voltage at a level of +58 VDC provided at the output of a full wave bridge rectifier circuit 39.

Data Record Circuits

Referring to the data record circuit 11, power to the inputs of the data channel is the +58 volt output of the bridge rectifier 39 which is connected to terminal K of the pulse initiator 21 which has outputs Y and Z connected to the data record network 22 comprised of resistors 23–25 and capacitors 26–27. Resistor 25 limits current flow through the winding 16 of the data record head. Resistor 23 and capacitor 26, and resistor 24 and capacitor 27, comprise 6 dB per octave RC filters which provide 20 dB of attenuation at 60 Hz.

A return to bias recording format is employed. In such format, a permanent magnet is used to saturate the tape prior to its passing over the record head. When contacts KY are closed, current flows from terminal Y and through the winding 16 in the direction of the arrow. Current flow in this direction magnetizes the tape in the same polarity as the permanent bias. A closure of the pulse initiator's KZ contacts (and opening of contacts KY) results in a head current opposite to that of the bias causing a pulse to be recorded on the data track of the tape. A subsequent closure of the KY contacts (and opening of KZ contacts) results in head current of the same polarity as the bias causing a further pulse to be recorded.

Time Record Circuit

The demand interval time pulses are also recorded using a return to bias format. Normally the current path of the time track head winding 17 is from the +14.1 VDC source through current limiting resistor 61', the winding 17 and resistor 62' to ground. Current flow through the head winding in this direction magnetizes the tape in the same direction as the permanent bias.

A time mark is recorded when the actuating arm of the solid state switch 32 falls into the detent 31a of the interval cam. When enabled, the switch 32 places one side of the winding 17 at a near ground potential. This causes head current to reverse direction and flow through current limiting resistor 63' and the winding 17 and to ground through the solid state switch 32. The head current reversal causes a timing pulse to be recorded on the tape. As indicated above, the time recorder circuit 12 obtains power from the battery 36 during loss of primary power to enable time interval pulses to be recorded during such power outage.

Power Outage Indicating Circuit

Referring to the power outage detecting circuit 50 shown in FIG. 2, the SCR device 53 has its anode connected to a conductor 57 which is normally energized at +14.1 VDC by way of a diode 58 which is connected between the output 40a of the voltage regulator circuit 40 and conductor 57. The diode 41 at the output of the voltage regulator 40 isolates the power outage circuit 13 from the battery 36, so that the power outage circuit is deenergized in the absence of primary power. The cathode of the SCR device 53 is connected over a resistor 59 to ground. The gate control or trigger circuit 60 for the SCR device includes resistor 61 and capacitor 62 which are connected in series between conductor 57 and ground, and resistor 63 which is connected between the gate and cathode of the SCR device 53. The outage switch contacts 52a are connected between the junction of resistor 61 and capacitor 62 at point 65 and the gate of the SCR device 53. Capacitor 62 is charged over resistor 61 when power is applied to conductor 57, and if contacts 52a are open. The charge time for capacitor 62 is in the order of 0.1 seconds. When the switch 52 closes, capacitor 62 discharges over the switch 52 and resistors 63 and 59 gating the SCR device on. If the contacts 52a are closed at the time power is restored, the capacitor 62 cannot charge, until the contacts reopen.

A capacitor 66 which is connected between conductor 57 and ground, is charged when power is applied to conductor 57. The resistor 58a limits the charging current to capacitor 66 following a power reapplication following a momentary power outage for which the SCR device is not turned off. This increases the charging time of capacitor 66 thereby reducing the rate of voltage increase at point 69 such that transistors 55 and 56 are not turned on. Upon loss of power, capacitor 66 maintains the SCR device 53 conducting for a delay interval in the order of 4 to 8 seconds which is determined by the value of resistor 63 which controls the hold on time for the SCR device 53.

Referring to the head driver circuit 51, capacitor 54 is connected in series with a resistor 68 between the cathode of the SCR device 53 at point 69 and the base of transistor 55 which is connected over a resistor 70 to ground. The transistor 55 has its collector connected over a resistor 71 to +14.1 volts at the cathode of diode 41 and its emitter connected to the base of transistor 56 which has its emitter connected to ground and its collector connected to one side of the time track head winding 17 and over resistor 61' to conductor 72 which is connected to the cathode of diode 41 at point 41A. The other side of the time track head winding 17 is connected over resistor 63' to conductor 72 and over resistor 62' to ground.

Transistors 55 and 56 are normally nonconducting. Accordingly, current flow through the time track head winding 17 is normally from conductor 72 through resistor 61', the winding 17 and resistor 62' to ground. When capacitor 54 is charging transistors 55 and 56 conduct so that the collector of transistor 56, and thus one side of the winding 17 is placed nearly at ground potential and current flow through the winding 17 is from conductor 72 through resistor 63', the winding 17 and to ground through transistor 56, reversing the direction of current flow through the winding. The current reversal is effected in the same manner with operation of the solid state switch, represented by contacts 32' in FIG. 2, which is connected in parallel with the output circuit of transistor 56.

The charge time for capacitor 54 is in the order of 2.2 seconds and after such time, transistors 55 and 56 are cutoff, and current flow through the winding is reversed.

Referring to FIG. 1, and in particular the outage switch cam 52b and the time interval cam 31, the outage switch operation preceeds that of the time interval switch by approximately 5% of one revolution of the cams or forty-five seconds for a fifteen minute demand interval. Accordingly, since transistors 55 and 56 are maintained conducting for a time in the order of 2.2 seconds, direction of current flow through the time head winding 17 is under the control of the solid state switch 32, enabling a timing interval pulse to be recorded approximately forty-two seconds after an outage pulse is recorded. This is illustrated in FIG. 3 where an output pulse OP1 is shown recorded on the time just before timing pulse TP2.

Operation of the Recorder Circuits

Referring to FIG. 1, at the time of installation of the recorder unit the recorder clock 18 is set to the correct time of day and, this operation serves to initialize the power outage indicating circuit 12 so that the SCR device 53 is conducting and capacitor 54 is charged. When the recorder unit has been installed, and prior to insertion of the tape cartridge, power is applied to input terminals of the power transformer 37 to energize the recorder circuits 10 to set the clock 18, the demand interval knob 19a is set to a zero reading, that is with its pointer vertical. Then the clock hands are set to the beginning of the current demand interval. For example, if the correct time of day is 10:57, the clock hands are set to 10:45, since a 15 minute demand interval is assumed. Then, the demand interval knob 19a is turned clockwise until the recorder clock 18 reads the correct time of day, 10:57 in the example.

Referring to FIG. 2, when power is initially applied to the recorder unit, the 14.8 volt potential at the output 40a of the voltage regulator 40 is extended over diode 58 to conductor 57, providing a potential of 14.1 volts on the conductor 57. Capacitor 66 is charged to +14.1 volts. Also, capacitor 62 charges over resistor 61 since switch contacts 52a are open at this time. The SCR device 53 and transistors 55 and 56 are nonconducting.

When the demand interval knob 19a is turned clockwise during setting of the clock 18, and the pointer 19b moves into the black zone, the outage switch 52 operates, closing contacts 52a. This permits capacitor 62 to discharge and trigger the SCR device 53 on. Accordingly, current flows from conductor 57 over the SCR device 53 and through capacitor 54 and resistors 68 and 70 to ground. This charges capacitor 54 and provides a potential at the base of transistor 55 which then conducts and causes transistor 56 to conduct for during the charging time of the capacitor 54. The transistors 55 and 56 are cut off when the capacitor 54 is charged.

After the recorder clock 18 has been set, the tape cartridge is inserted into the recorder unit, and the recorder unit is prepared for operation. In normal operation, a data pulse is recorded on the data track each time the pulse initiator contacts KY-KZ reverse. The demand interval switch 32 is operated once each demand interval to record a time mark on the tape, such as time marks TP1-TP3 as shown in FIG. 3.

Referring to the power outage indicating circuit 13 shown in FIG. 2, during normal operation, line voltage is applied to the recorder circuits 10 and the +14.8 volt output of the regulator circuit 40 via diode 58 provides conductor 57 of the power outage indicating circuit at 14.1 VDC to maintain the SCR device 53 conducting. Although the outage switch contacts 52a are alternately closed and opened once each demand interval as the tape moves and its associated cam 52b rotates, no power outage indication is recorded since the SCR device 53 is conducting and capacitor 54 remains charged.

Should a power outage occur, the +14.8 volt voltage regulator output is removed from the input of the power outage indicating circuit 50. Capacitor 66 begins to discharge over the SCR device 53 and resistor 59 for a time in the order of 4 to 8 seconds, maintaining SCR device 53 conducting during this time. Capacitor 54 also discharges over resistors 59, 70 and 68.

Relay 35 of the battery carryover circuit 33 drops out and connects the power input of the oscillator/driver 34 to the battery 36, and connects the tape drive motor 15 to the output of the oscillator driver 34. The time record circuits 12 are energized by power from the battery 36. The battery carryover maintains tape motion and time marks continue to be recorded at each 15 minute interval. The power outage switch contacts 52a close once during each demand interval, but a power outage indication is not recorded.

When AC power is restored, the battery carryover circuit 35 is disabled and regulator circuit 40 powers the recorder circuits, and provides +14.1 VDC on conductor 57 enabling capacitor 66 to charge. Also, assuming that switch contacts 52a are open capacitor 62 charges over resistor 61. The next time switch contacts 52a close, the SCR gate circuit is completed and capacitor 62 discharges over contacts 52a and resistors 63 and 59, causing the SCR device 53 to conduct. Capacitor 54 charges to the voltage dropped across resistor 59 producing a pulse at the base of transistor 55 which causes transistors 55 and 56 to conduct for approximately 2.2 seconds and place one side of the time track head winding 17 at near ground potential. Accordingly, the direction of head current through winding 17 is reversed causing a power outage indication, such as pulse OP1 in FIG. 3, to be recorded on the time track. When capacitor 54 becomes charged after approximately 2.2 seconds, transistors 55 and 56 are cut off, reversing the direction of current flow through the time record head winding 17. Once the SCR device 53 fires, it remains conducting unless a subsequent power outage should occur. As indicated above, if contacts 52 are closed at the time power is restored, the capacitor 62 cannot charge until the contacts 52a reopen upon rotation of the cam 52. When contacts 52a reopen, capacitor 62 charges and the operation is as described above with an outage pulse being recorded is in association with the next succeeding timing pulse.

As the tape continues to be advanced, timing cam 31 enables the interval switch 32 to operate and effect current reversal through the time head winding to record time interval pulse TP2 (FIG. 3) on the tape. The outage switch contacts 52a open and the time interval switch 32 is disabled, with continued rotation of associated cams 52 and 31, at the time when the dial pointer 19b moves out of the black area of the interval dial (FIG. 1). As the tape continues to move, the power outage switch opens and closes once each demand interval. However, no further outage pulses are recorded as long as a DC voltage is applied to the anode of the SCR device 53.

Having thus disclosed in detail a preferred embodiment of my invention, persons skilled in the art will be able to modify certain of the structure which has been disclosed and to substitute equivalent elements for those which have been illustrated; and it is, therefore, intended that all such modifications and substitutions be covered as they are embraced within the spirit and scope of the appended claims.

I claim:

1. In a recording apparatus for recording data and time information derived from an associated meter device, said recording apparatus having data recording means for recording data signals on a magnetic tape, and time recording means including an interval timer operative to generate time reference signals which represent predetermined intervals of time of operation of said meter device, and a time record circuit having a recording head for recording said time reference signals on said magnetic tape as a time reference for said data signals, said time recording means being energized by power from a power circuit means whenever power is applied to said meter device, and being energized by power from an auxiliary source during an interruption of power to said meter device, permitting recording of time reference signals both during the presence and the interruption of power to said meter device; a power outage indicating circuit for detecting the presence of power and the interruption of power to said meter device, said power outage indicating circuit comprising: a power outage detecting circuit including a controlled solid state switching device operable between conducting and non-conducting states energizing circuit means connected to said power circuit means for applying power to said detecting circuit whenever power is applied to said meter device; isolation circuit means for isolating at least said energizing circuit means and said detecting circuit from said auxiliary source whereby said switching device is operated to one of said states following an interruption of power to said meter device; and said detecting circuit including enabling circuit means for causing said switching device to be operated to said other state to generate a power outage indication following the restoration of power to said meter device; outage indication recording circuit means including timing circuit means enabled in response to the outage indication generated as said switching device is operated from said one state to said other state for generating a timing signal, and second switching means responsive to said timing signal for controlling said time record circuit to record a power outage indicating signal on said magnetic tape, said enabling means including outage switch means coupled to said interval timer and operated thereby in timed relationship therewith to cause the power outage indication to be generated in association with a succeeding time reference signal generated following the restoration of power and said switching device being maintained in said other state, inhibiting said indication recording circuit means as long as power continues to be applied to said meter device.

2. A recording apparatus as set forth in claim 1 wherein said energizing circuit means includes means for delaying the operation of said switching device from said one state to said other state for a predetermined time interval following an interruption of power.

3. A recording apparatus as set forth in claim 1 wherein said timing circuit means includes a capacitor, said switching device being connected in a charging path for said capacitor to permit said capacitor to charge and generate said timing signal in response to said switching device's being operated from said other state to said one state, and discharge circuit means for discharging said capacitor when said switching device is operated to said other state.

4. A recording apparatus as set forth in claim 1 wherein said enabling circuit means further comprises circuit means including a capacitor which is charged following restoration of power, and discharge circuit means connected to a control input of said switching device, said discharge circuit means including said outage switch which is operable to cause said capacitor to discharge over a discharge path including said discharge circuit means to operate said switching device to said one state.

5. A recording apparatus as set forth in claim 4 wherein said outage switch normally interrupts said discharge path, and is operable to complete said discharge path, said capacitor being prevented from charging whenever said discharge path is completed.

6. A recording apparatus as set forth in claim 4 wherein said interval timer comprises interval timer switch means operable to generate said time reference signals, and wherein said outage switch includes operating means coupled to said interval timer for operating said outage switch at a predetermined time relative to the operation of said interval timer switch means to cause said power outage indicating signal to be recorded on said tape in a predetermined relationship relative to a time reference signal recorded on said tape following an interruption and restoration of power.

7. A recording apparatus as set forth in claim 1 wherein said time record circuit includes bias means for providing current flow through a winding of said record head in a first direction, said second switching means being responsive to said timing signal to reverse the direction of current flow through said record head winding to thereby record said power outage indicating signal on said magnetic tape.

8. In a recording apparatus for recording data and time information derived from an associated meter device, including time recording means having an interval timer operative to provide time reference signals which represent predetermined intervals of time of operation of said meter device, and a time record circuit having a record head for recording said time reference signals on a magnetic tape, said time recording means being energized by power from a power circuit means whenever power is applied to said meter device, and being energized by power from an auxiliary source during an interruption of power to said meter device, permitting recording of time reference signals both during the presence and the interruption of power to said meter device; a power outage indicating circuit for detecting the presence of power and the interruption of power to said meter device, said power outage indicating circuit comprising: a power outage detecting circuit including a controlled solid state switching device operable between conducting and nonconducting states; energizing circuit means connected to said power circuit means for applying power to said detecting circuit whenever power is applied to said meter device; isolation circuit means for isolating at least said energizing circuit means and said detecting circuit from said auxiliary souce whereby said switching device is operated to said nonconducting state following an interruption of power to said meter device; and said detecting circuit including enabling circuit means for causing said switching device to be operated to said conducting state to generate a power outage indication following the restoration of power to said meter device, and outage indication recording circuit means including timing circuit means having a capacitor which is charged in response to the outage indication generated as said switching device is operated from said nonconducting state to said conducting state, and second switching means enabled while said capacitor is charging to control said time record circuit to record a power outage indicating signal on said magnetic tape, said enabling means including outage switch means coupled to said interval timer and operated thereby in timed relationship therewith to cause the power outage indication to be generated in association with a succeeding time reference signal generated following the restoration of power, said second switching means being disabled when said capacitor is charged, and said switching device being maintained in said conducting state causing said capacitor to be maintained charged thereby preventing reenabling of said second switching means as long as power continues to be supplied to said meter device.

9. A recording circuit as set forth in claim 8 wherein said energizing circuit means provides a DC potential between input and output electrodes of said switching device for maintaining said switching device in said one state, said capacitor being connected in a charging path including said switching device.

10. A recording circuit as set forth in claim 9 wherein said energizing circuit means includes further capacitor means which charges in response to applied power and which discharges over said switching device in response to loss of power, for maintaining said switching device in said one state for a predetermined time interval following loss of power, and wherein said enabling means includes resistance means connected between said output electrode and a control electrode of said switching device for determining said time interval.

* * * * *

UNITED STATES PATENT AND TRADEMARK OFFICE
CERTIFICATE OF CORRECTION

PATENT NO. : 4,210,937
DATED : July 1, 1980
INVENTOR(S) : Robert E. Dyer

It is certified that error appears in the above-identified patent and that said Letters Patent are hereby corrected as shown below:

In the References Cited:

U.S.P.N. 3,913,129, "Synder et al" should read -- Snyder et al --.

In the Specification:

Column 1, line 46, insert -- be -- between "to" and "recorded".

Column 1, line 55, "the" should read -- then --.

Column 4, line 37, "thse" should read -- these --.

Column 4, line 50, insert -- of -- after "number".

Column 4, line 50, "event" should read -- of events --.

Column 7, line 37, delete "for".

Column 8, line 35, delete "is".

In the Claims:

Claim 8, column 10, line 46, "souce" should read -- source --.

UNITED STATES PATENT AND TRADEMARK OFFICE
CERTIFICATE OF CORRECTION

PATENT NO. : 4,210,937

DATED : July 1, 1980

INVENTOR(S) : Robert E. Dyer

It is certified that error appears in the above-identified patent and that said Letters Patent are hereby corrected as shown below:

In the Drawings:

Fig. 2, resistors "61, 62, and 63" in the Time Track Recording Circuit 12 (right-hand portion of the drawing figure) should be labeled -- 61', 62', and 63' --.

Signed and Sealed this

Seventeenth Day of August 1982

[SEAL]

Attest:

GERALD J. MOSSINGHOFF

Attesting Officer     Commissioner of Patents and Trademarks